(12) United States Patent
Wang et al.

(10) Patent No.: US 12,048,234 B2
(45) Date of Patent: *Jul. 23, 2024

(54) DISPLAY DEVICE HAVING ULTRAVIOLET LIGHT BLOCKING PROPERTIES

(71) Applicant: SAMSUNG DISPLAY CO., LTD., Yongin-si (KR)

(72) Inventors: Seong Min Wang, Seongnam-si (KR); Beohmrock Choi, Seoul (KR); Yongho Yang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 2 days.

This patent is subject to a terminal disclaimer.

(21) Appl. No.: 17/656,016

(22) Filed: Mar. 23, 2022

(65) Prior Publication Data

US 2022/0216435 A1 Jul. 7, 2022

Related U.S. Application Data

(62) Division of application No. 16/268,147, filed on Feb. 5, 2019, now Pat. No. 11,335,866.

(30) Foreign Application Priority Data

Mar. 8, 2018 (KR) ........................ 10-2018-0027537

(51) Int. Cl.
*H10K 77/10* (2023.01)
*H10K 59/00* (2023.01)
*H10K 59/12* (2023.01)

(52) U.S. Cl.
CPC .............. *H10K 77/10* (2023.02); *H10K 59/00* (2023.02); *H10K 59/12* (2023.02)

(58) Field of Classification Search
CPC .. H01L 27/14678; H10K 59/12; H10K 59/13; H10K 59/131; H10K 59/1315; H10K 59/00; H10K 59/70; H10K 59/80–88; H10K 77/10; H10K 59/8792; H10K 50/865

See application file for complete search history.

(56) References Cited

U.S. PATENT DOCUMENTS

| | | | |
|---|---|---|---|
| 6,025,894 A | 2/2000 | Shirasaki et al. | |
| 7,492,095 B2 | 2/2009 | Park et al. | |
| 8,350,275 B2 | 1/2013 | Yan et al. | |
| 8,362,279 B2 | 1/2013 | Gao | |

(Continued)

FOREIGN PATENT DOCUMENTS

| | | |
|---|---|---|
| CN | 107004130 | 8/2017 |
| JP | 2004-354984 | 12/2004 |

(Continued)

*Primary Examiner* — Latanya N Crawford Eason
(74) *Attorney, Agent, or Firm* — F. Chau & Associates, LLC

(57) ABSTRACT

A display device includes a substrate, a thin film transistor disposed on the substrate, and a display element electrically connected to the thin film transistor. The substrate includes a first substrate layer, a second substrate layer disposed on the first substrate layer, a first barrier layer disposed between the first substrate layer and the second substrate layer, and a first ultraviolet light blocking layer disposed between the first substrate layer and the second substrate layer.

12 Claims, 10 Drawing Sheets

(56) References Cited

U.S. PATENT DOCUMENTS

| | | |
|---|---|---|
| 8,626,056 B2 | 1/2014 | Song et al. |
| 9,444,076 B2 | 9/2016 | No et al. |
| 9,709,844 B2 | 7/2017 | Yim et al. |
| 9,954,043 B2 | 4/2018 | Fark et al. |
| 10,243,031 B2 | 3/2019 | Lee et al. |
| 10,256,424 B2 | 4/2019 | Jang |
| 10,438,046 B2 | 10/2019 | He |
| 10,600,824 B2 | 3/2020 | Lee et al. |
| 10,763,457 B2 | 9/2020 | Lee et al. |
| 11,335,866 B2 * | 5/2022 | Wang ............... H10K 59/126 |
| 2007/0057932 A1 | 3/2007 | Shin et al. |
| 2007/0207671 A1 | 9/2007 | Morisue et al. |
| 2012/0139866 A1 * | 6/2012 | Jung ............... H01L 27/1446 |
| | | 257/E31.127 |
| 2013/0140982 A1 | 6/2013 | Park |
| 2016/0093833 A1 | 3/2016 | No et al. |
| 2017/0081090 A1 | 3/2017 | Boyer et al. |
| 2017/0336831 A1 | 11/2017 | Zhang et al. |
| 2019/0131377 A1 | 5/2019 | Kwon et al. |
| 2019/0280224 A1 | 9/2019 | Wang et al. |
| 2019/0295456 A1 * | 9/2019 | Ling ............... G06V 40/1306 |
| 2019/0362119 A1 | 11/2019 | He et al. |
| 2020/0152715 A1 | 5/2020 | Hao et al. |

FOREIGN PATENT DOCUMENTS

| | | |
|---|---|---|
| KR | 10-2007-0030619 | 3/2007 |
| KR | 10-0272046 | 8/2008 |
| KR | 100860278 | 9/2008 |
| KR | 10-2010-0029991 | 4/2010 |
| KR | 10-2011-0110590 | 10/2011 |
| KR | 1020130017312 | 2/2013 |
| KR | 10-2013-0132108 | 12/2013 |
| KR | 1020160062645 | 5/2015 |
| KR | 10-2016-0024061 | 3/2016 |
| KR | 10-2017-0080779 | 7/2017 |
| KR | 10-2017-0106425 | 9/2017 |
| KR | 1020170136972 | 12/2017 |

\* cited by examiner

DISPLAY DEVICE HAVING ULTRAVIOLET LIGHT BLOCKING PROPERTIES

CROSS-REFERENCE TO RELATED APPLICATION(S)

This application is a Division of co-pending U.S. patent application Ser. No. 16/268,147, filed on Feb. 5, 2019, which claims priority under 35 USC § 119 to Korean Patent Application No. 10-2018-0027537, filed on Mar. 8, 2018 in the Korean Intellectual Property Office (KIPO), the entire disclosures of which are incorporated by reference herein.

TECHNICAL FIELD

The present disclosure relates to a display device and, more specifically, to a display device having ultraviolet light blocking properties.

DISCUSSION OF THE RELATED ART

A display device is a device that generates an image that can be viewed by a user. Display devices have been incorporated into a wide variety of electronic products such as information devices, for example, smartphones and the like. Among the various types of display devices commonly in use, an organic light emitting diode (OLED) display device is attracting attention as a display device having excellent characteristics, such as a slim profile, light weight, and low power consumption.

As outdoor use of information devices such as smartphones increases, display devices may be exposed to sunlight for longer periods of time. Furthermore, ultraviolet light may be used in various processes that are part of manufacturing display devices. Exposure to ultraviolet light may damage various components of the display device.

SUMMARY

A display device includes a substrate, a thin film transistor disposed on the substrate, and a display element electrically connected to the thin film transistor. The substrate includes a first substrate layer, a second substrate layer disposed on the first substrate layer, a first barrier layer disposed between the first substrate layer and the second substrate layer, and a first ultraviolet light blocking layer disposed between the first substrate layer and the second substrate layer.

A display device includes a substrate, a thin film transistor disposed on the substrate, a display element electrically connected to the thin film transistor, and a sensor disposed under the substrate. The substrate includes a first substrate layer, a second substrate layer disposed on the first substrate layer, and an ultraviolet light blocking layer disposed between the first substrate layer and the second substrate layer.

A display device includes a substrate having a plurality of ultraviolet light blocking particles disposed therein. A thin film transistor is disposed on the substrate. A display element is electrically connected to the thin film transistor.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
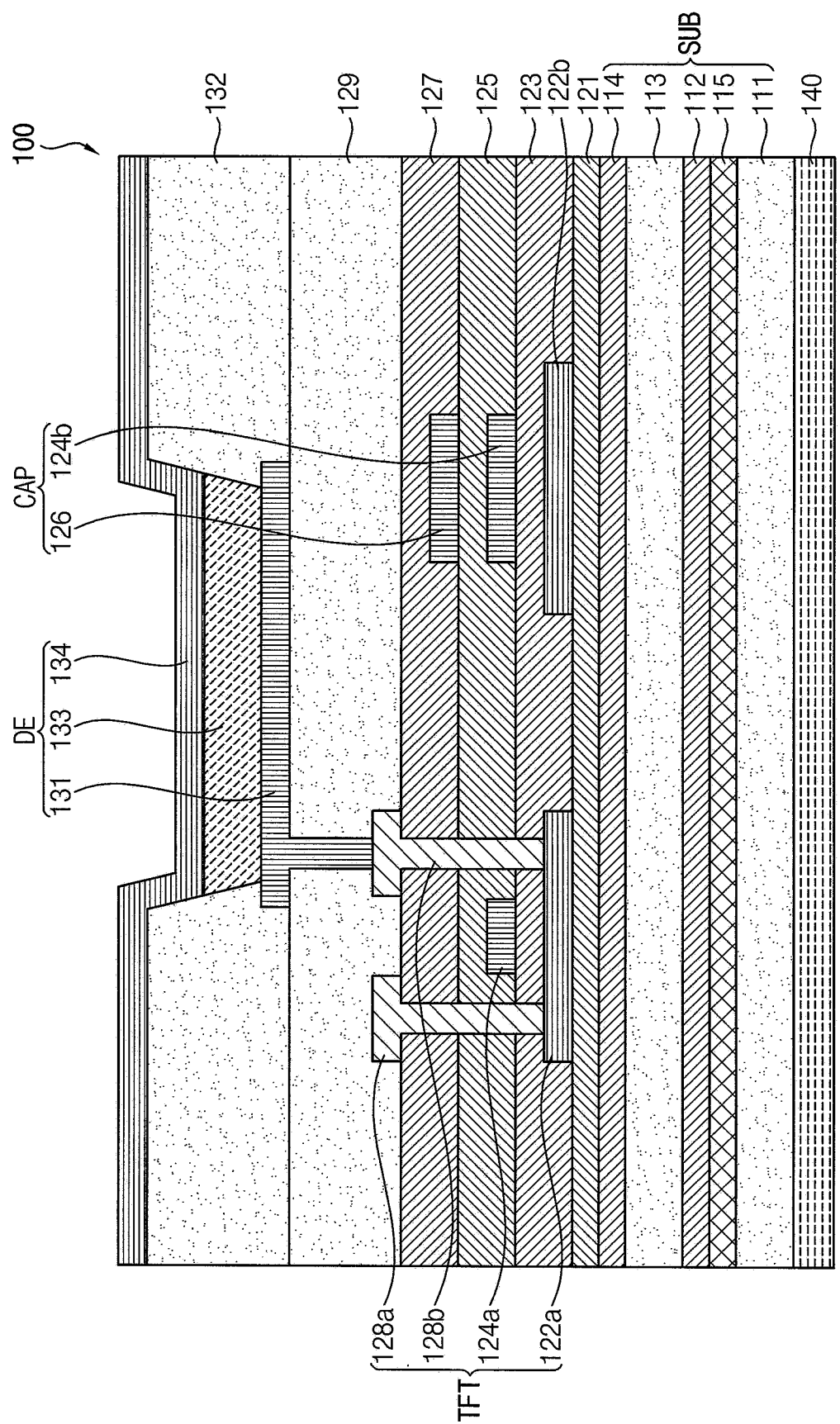
FIGS. 1, 2, 3, 4, and 5 are cross-sectional views illustrating a display device according to exemplary embodiments of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Hereinafter, a display device according to exemplary embodiments of the present disclosure will be described with reference to FIGS. 1, 2, 3, 4, and 5.

FIGS. 1, 2, 3, 4, and 5 are cross-sectional views illustrating a display device according to exemplary embodiments of the present disclosure.

Referring to FIGS. 1, 2, 3, and 4, a display device 100, according to exemplary embodiments of the present disclosure, may include a substrate SUB, a pixel circuit disposed on the substrate SUB, and a display element DE disposed on the pixel circuit. The pixel circuit may include a thin film transistor TFT and a capacitor CAP. The display device 100 may further include a protective film 140 disposed under the substrate SUB.

The substrate SUB may include a first substrate layer 111, a first barrier layer 112, a second substrate layer 113, a second barrier layer 114, and a first ultraviolet light blocking layer 115.

The first substrate layer 111 may include a flexible material that is also electrically insulating. For example, the first substrate layer 111 may include an organic material such as polyimide (PI), polyethylene naphthalate (PEN), polyethylene terephthalate (PET), polyarylate (PAR), polycarbonate (PC), polyetherimide (PEI), polyethersulfone (PS), or the like. However, the material of the first substrate layer 111 is not limited thereto, and any material that is relatively flexible and electrically insulating may be used as the material of the first substrate layer 111.

The first barrier layer 112 may be disposed on the first substrate layer 111. The first barrier layer 112 may include an inorganic material. For example, the first barrier layer 112 may include a silicon-based material such as amorphous silicon (a-Si), silicon oxide ($SiO_x$), silicon nitride ($SiN_x$), or the like. The first barrier layer 112 may be formed on the first substrate layer 111 that is vulnerable to oxygen and moisture. Accordingly, the first barrier layer 112 is configured to protect the first substrate layer 111 from damage and is configured to prevent impurities such as oxygen and moisture from permeating into the sensitive layers of the display device 100.

The second substrate layer 113 may be disposed on the first barrier layer 112. The second substrate layer 113 may include a flexible material that is electrically insulating. The second substrate layer 113 may include a material substantially the same as that of the first substrate layer 111, or may have a thickness substantially the same as that of the first substrate layer 111. However, the present invention is not limited thereto, and the first substrate layer 111 and the second substrate layer 113 may include different materials, or may have different thicknesses from each other.

The second barrier layer 114 may be disposed on the second substrate layer 113. The second barrier layer 114 may include an inorganic material. The second barrier layer 114 may include a material substantially the same as that of the first barrier layer 112, or may have a thickness substantially the same as that of the first barrier layer 112. However, the present invention is not limited thereto, and the first barrier layer 112 and the second barrier layer 114 may include different materials, or may have different thicknesses from each other. The second barrier layer 114 may be formed on the second substrate layer 113 that is vulnerable to oxygen and moisture thereby protecting the second substrate layer 113 from damage and preventing impurities such as oxygen and moisture from permeating into the display device 100.

The first ultraviolet light blocking layer 115 may be disposed between the first substrate layer 111 and the second substrate layer 113.

The display device 100 may be exposed to ultraviolet light that is cast upon a bottom of the substrate SUB. Here, the ultraviolet light may be from sunlight, or may be ultraviolet light used during a process of manufacturing the display device 100. For example, ultraviolet light may be used during the process of manufacturing the display device 10 to cure other members formed under the substrate SUB.

The ultraviolet light cast onto the bottom of the substrate SUB may adversely affect the thin film transistor TFT, the capacitor CAP, and/or the display element DE. The first ultraviolet light blocking layer 115 may be formed in the substrate SUB thereby blocking the ultraviolet light from traveling to the bottom of the substrate SUB. Accordingly, damage of the thin film transistor TFT, the capacitor CAP, and the display element DE disposed over the substrate SUB may be prevented.

The first ultraviolet light blocking layer 115 may include a material absorbing ultraviolet light.

In an exemplary embodiment of the present disclosure, the first ultraviolet light blocking layer 115 may include an organic material such as a benzophenone compound, a benzotriazole compound, a benzoate compound, a cyanoacrylate compound, a triazine compound, an oxanilide compound, and/or a salicylate compound.

Examples of the benzophenone compound may include, for example, 2,4-dihydroxybenzophenone, 2-hydroxy-4-methoxybenzophenone, 2-2-dihydroxybenzophenone, 2,2',4',4'-tetrahydroxybenzophenone, 2-hydroxy-4-octylbenzophenone, 4-dodecyloxy-2'-hydroxy-4,4'-dimethoxybenzophenone, and the like.

Examples of the benzotriazole compound may include 2-(5-methyl-2-hydroxyphenyl)benzotriazole, 2-(2-hydroxy-3,5-bis(α,α-dimethylbenzyl)phenyl]-2H-benzotriazole, 2-(3,5-di-t-butyl-2-hydroxyphenyl)benzotriazole, 2-(3-t-butyl-5-methyl-2-hydroxyphenyl)-5-chlorobenzotriazole, 2-(3,5-di-t-butyl-2-hydroxyphenyl)-5-chlorobenzotriazole, 2-(3,5-di-t-acyl-2-hydroxyphenyl)benzotriazole, 2-(2'-hydroxy-5'-t-octylphenyl)benzotriazole, and the like.

Examples of the benzoate compound may include 2,4-di-t-butylphenyl-3',5'-di-t-butyl-4-hydroxybenzoate and the like.

Examples of the triazine compound may include 2-[4-[(2-hydroxy-3-dodecyloxypropyl)oxy]-2-hydroxyphenyl]-4,6-bis(2,4-dimethylphenyl)-1,3,5-triazine, and the like.

Examples of the salicylate compound may include phenyl salicylate, 4-t-butylphenylsalicylate, etc.

Chemical formulas of the benzophenone compound and the benzotriazole compound from among the above-stated ultraviolet light absorbent organic materials are shown below.

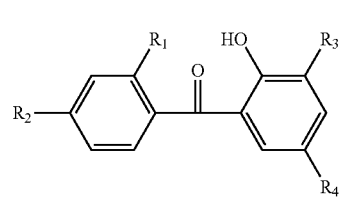

<Formula 1>

In Formula 1 above, $R_1$ may be hydrogen (H), an alkyl group, or a hydroxyl group, $R_2$ may be hydrogen (H), an alkyl group, or a phenyl group, $R_3$ may be hydrogen (H) or an alkyl group, and $R_4$ may be hydrogen (H) or an alkoxy group.

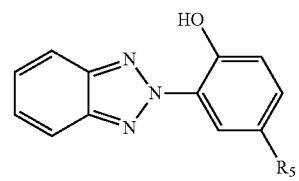

<Formula 2>

In Formula 2 above, $R_5$ may be hydrogen (H) or an alkyl group.

In Formulas 1 and 2, each of the benzophenone compound and the benzotriazole compound has a hydroxyl group (—OH). The first ultraviolet light blocking layer 115 may include, for example, a monomer material having a hydroxyl group (—OH), which may provide hydrogen bonding. Ultraviolet light from outside may be absorbed, for example, due to an excited-state intramolecular proton transfer (ESIPT) phenomenon. For example, the first ultraviolet light blocking layer 115 may include a compound having atoms adjacent to a hydroxyl group (—OH) and having non-covalent electron pairs, such as oxygen (O) atoms or nitrogen (N) atoms, where hydrogen bonding may be generated between a hydroxyl group (—OH) and the atoms having non-covalent electron pairs. The compound in the ultraviolet light blocking layer 115 excited by absorbing ultraviolet light may undergo phototautomerization, in which protons move in excited molecules, and thus hydrogen (H) atoms may be released from the hydroxyl group (—OH) to form a stable keto-form molecules. As a result, heat may be released. Therefore, ultraviolet light incident onto the first ultraviolet light blocking layer 115 may be converted into heat energy and radiated to the outside, which may reduce or prevent ultraviolet light from being transmitted into the display device 100.

According to an exemplary embodiment of the present disclosure, the first ultraviolet light blocking layer 115 may include an inorganic material such as calcium oxide (CaO) and/or lithium fluorine (LiF). For example, when supplying oxygen on calcium after depositing the calcium, a layer on which the calcium is deposited may react with the oxygen to turn into calcium oxide (CaO), and the first ultraviolet light blocking layer 115 including calcium oxide (CaO) may be formed. Alternatively, the first ultraviolet light blocking layer 115 may be formed by exposing deposited calcium to ultraviolet light in an oxygen atmosphere.

Figure 2:
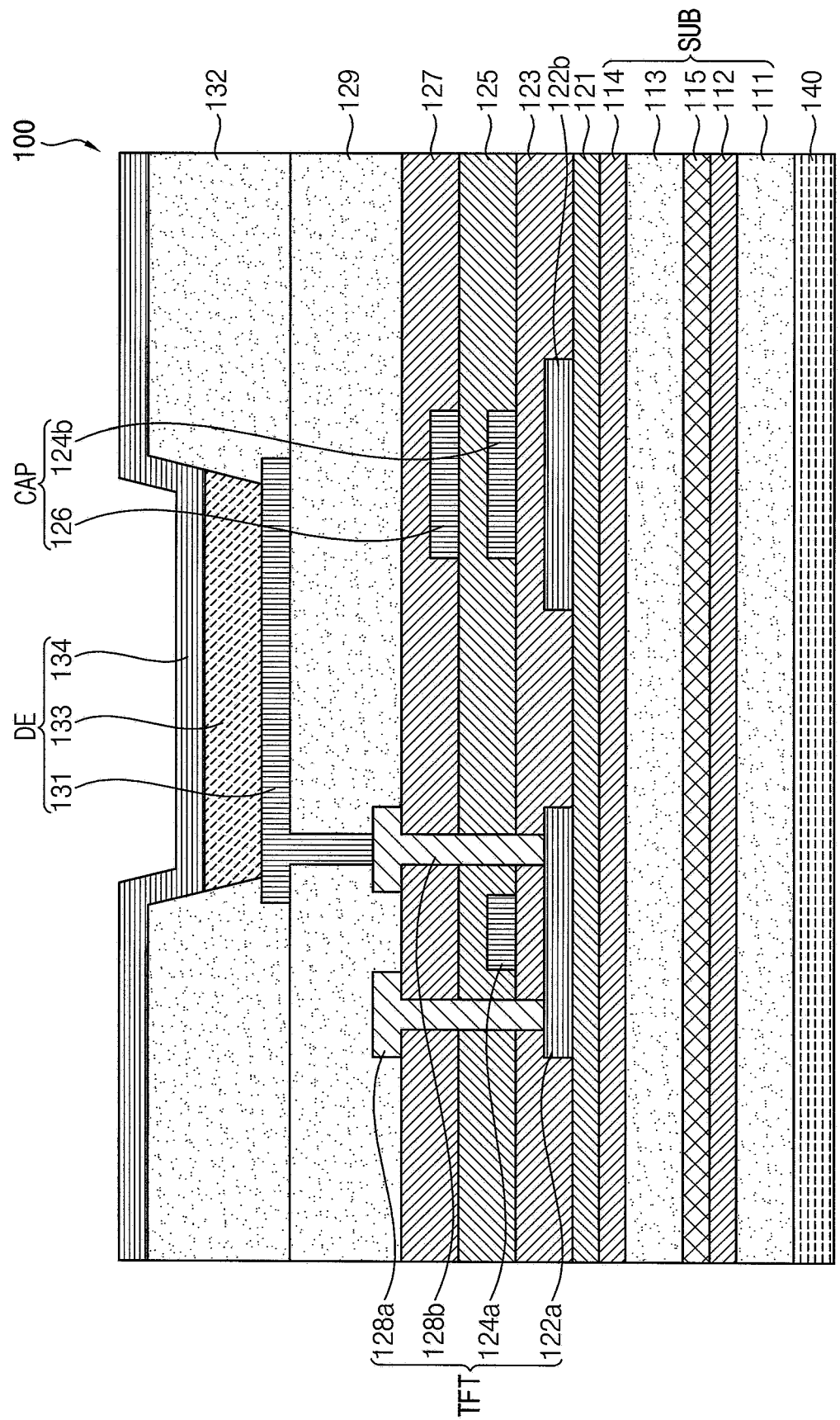

In an exemplary embodiment of the present disclosure, the first ultraviolet light blocking layer 115 may be disposed between the first substrate layer 111 and the first barrier layer 112 as illustrated in FIG. 1, or may be disposed between the first barrier layer 112 and the second substrate layer 113 as illustrated in FIG. 2. The substrate SUB may include single ultraviolet light blocking layer disposed between the first substrate layer 111 and the second substrate layer 113.

Figure 3:
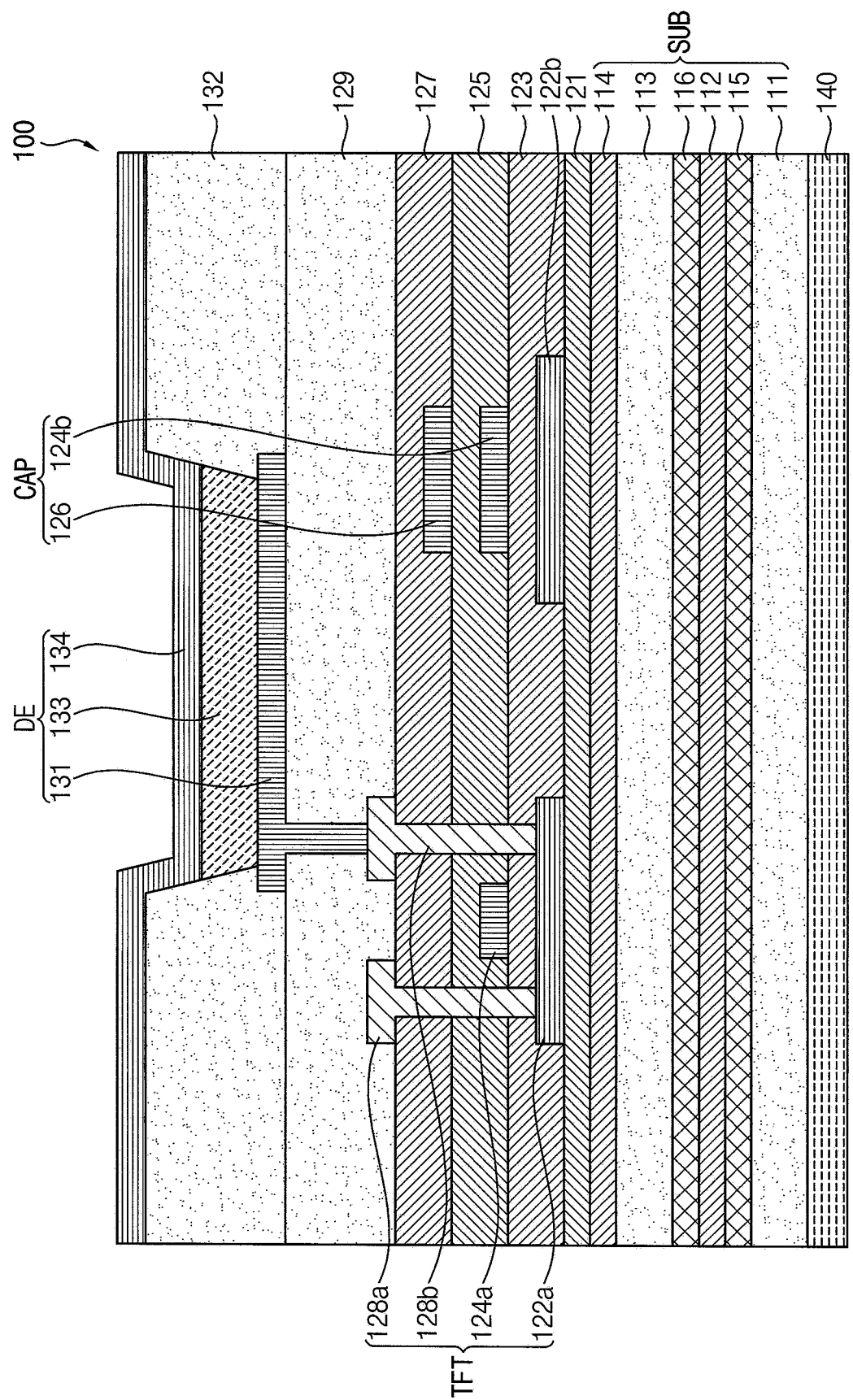

In an exemplary embodiment of the present disclosure, the substrate SUB may further include a second ultraviolet light blocking layer 116 as illustrated in FIG. 3. The second ultraviolet light blocking layer 116 may be disposed between the first substrate layer 111 and the second substrate layer 113. The second ultraviolet light blocking layer 116 may be formed in the substrate SUB thereby blocking the ultraviolet light that is cast onto the bottom of the substrate SUB. Accordingly, damage of the thin film transistor TFT, the capacitor CAP, and the display element DE disposed over the substrate SUB may be prevented.

The second ultraviolet blocking layer 116 may include a material substantially the same as that of the first ultraviolet blocking layer 115, or may have a thickness substantially the same as that of the first ultraviolet blocking layer 115. However, the present invention is not limited thereto, and the first ultraviolet blocking layer 115 and the second ultraviolet blocking layer 116 may include different materials, or may have different thicknesses from each other.

The first ultraviolet blocking layer 115 may be disposed between the first substrate layer 111 and the first barrier layer 112, and the second ultraviolet blocking layer 116 may be disposed between the first barrier layer 112 and the second substrate layer 113. The substrate SUB may include double ultraviolet light blocking layers disposed between the first substrate layer 111 and the second substrate layer 113.

Figure 4:
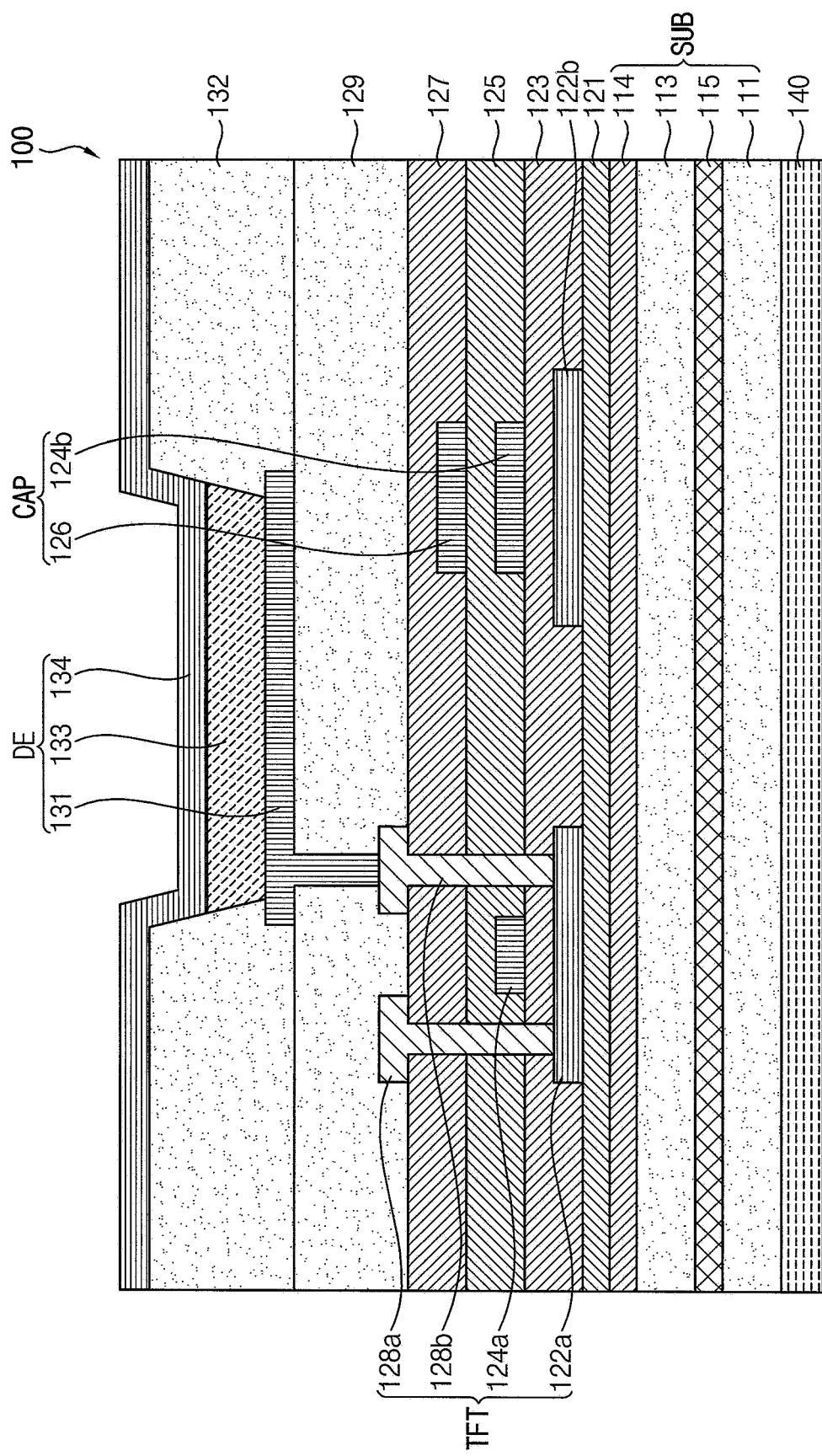

In an exemplary embodiment of the present disclosure, the first ultraviolet light blocking layer 115 may be disposed between the first substrate layer 111 and the second substrate layer 113 instead of the first barrier layer 112 as illustrated in FIG. 4. For example, the substrate SUB might not include the first barrier layer 112, and may instead include the first ultraviolet light blocking layer 115. The first ultraviolet light blocking layer 115 may act as the first barrier layer 112.

The first ultraviolet light blocking layer 115 may include an inorganic material such as calcium oxide (CaO) and/or lithium fluorine (LiF) among the aforementioned organic material and inorganic material. Accordingly, the first ultraviolet light blocking layer 115 may block ultraviolet light, and may prevent impurities such as oxygen and moisture from permeating into the display device 100.

A buffer layer 121 may be disposed on the substrate SUB. The buffer layer 121 may prevent impurities from permeating through the substrate SUB. Further, the buffer layer 121 may planarize the surface of the substrate SUB. Alternatively, the buffer layer 121 may be omitted.

The thin film transistor TFT and the capacitor CAP may be disposed on the buffer layer 121. The thin film transistor TFT may supply voltage or current to the display element DE. The display device 100 may include a thin film transistor with a top-gate structure, however, the present invention is not limited thereto. The display device 100 may include a thin film transistor with a bottom-gate structure. The thin film transistor TFT may include a first active pattern 122a, a gate electrode 124a, a source electrode 128a, and a drain electrode 128b. The capacitor CAP may maintain a voltage of the thin film transistor TFT. The capacitor CAP may include a lower electrode 124b and an upper electrode 126.

A semiconductor layer 122a and 122b may be disposed on the buffer layer 121. The semiconductor layer 122a and 122b may include the first active pattern 122a and a second active pattern 122b. The first active pattern 122a and the second active pattern 122b may be spaced apart from each other. The semiconductor layer 122a and 122b may include amorphous silicon, polycrystalline silicon, or the like. Alternatively, the semiconductor layer 122a and 122b may include an oxide semiconductor.

A first insulation layer 123 may be disposed on the semiconductor layer 122a and 122b. The first insulation layer 123 may insulate the gate electrode 124a from the first active pattern 122a, and may insulate the lower electrode 124b from the second active pattern 122b. The first insulation layer 123 may include silicon nitride ($SiN_x$), silicon oxide ($SiO_x$), or the like.

A first conductive layer may be disposed on the first insulation layer 123. The first conductive layer may include the gate electrode 124a and the lower electrode 124b. The gate electrode 124a may at least partially overlap the first active pattern 122a. The lower electrode 124b may be spaced apart from the gate electrode 124a, and may at least partially overlap the second active pattern 122b. A thin film transistor including the second active pattern 122b and the lower electrode 124b acting as a gate may be defined. The first conductive layer may include gold (Au), silver (Ag), copper (Cu), nickel (Ni), platinum (Pt), palladium (Pd), aluminum (Al), molybdenum (Mo), and/or titanium (Ti).

A second insulation layer 125 may be disposed on the first conductive layer. The second insulation layer 125 may insulate the upper electrode 126 from the lower electrode 124b. The second insulation layer 125 may include silicon nitride ($SiN_x$), silicon oxide ($SiO_x$), or the like.

A second conductive layer may be disposed on the second insulation layer 125. The second conductive layer may include the upper electrode 126. The upper electrode 126 may at least partially overlap the lower electrode 124b. The second conductive layer may include Au, Ag, Cu, Ni, Pt, Pd, Al, Mo, and/or Ti.

A third insulation layer 127 may be disposed on the second conductive layer. The second insulation layer 125 and the third insulation layer 127 may together insulate both the source electrode 128a and the drain electrode 128b from the gate electrode 124a. The third insulation layer 127 may include silicon nitride ($SiN_x$), silicon oxide ($SiO_x$), or the like.

A third conductive layer may be disposed on the third insulation layer 127. The third conductive layer may include the source electrode 128a and the drain electrode 128b. The source electrode 128a and the drain electrode 128b may be in contact with the first active pattern 122a. For example, the source electrode 128a and the drain electrode 128b may be in contact with the first active pattern 122a through respective contact holes formed in the first insulation layer 123, the second insulation layer 125, and the third insulation layer 127. The third conductive layer may include Au, Ag, Cu, Ni, Pt, Pd, Al, Mo, and/or Ti. For example, the third conductive layer may be formed as a multi-layered structure such as Mo/Al/Mo or Ti/Al/Ti.

A planarization layer 129 may be disposed on the third conductive layer. The planarization layer 129 may provide a planarized surface over the third conductive layer. The planarization layer 129 may include an organic material such as photoresist, polyacrylate-based resin, polyimide-based resin, siloxane-based resin, acryl-based resin, epoxy-based resin, or the like.

The display element DE may be disposed on the planarization layer 129. The display element DE may be configured to emit light based on voltage or current supplied from the thin film transistor TFT. In an exemplary embodiment of the present disclosure, the display element DE may be an organic light emitting element, and may include a first electrode 131, an organic light emitting layer 133, and a second electrode 134. However, the display element DE is not limited thereto, and various display elements such as a liquid crystal display element, or the like may be used as the display element DE.

The first electrode 131 may be disposed on the planarization layer 129. The first electrode 131 may be patterned for each pixel of the display device 100. The first electrode 131 may be in contact with the drain electrode 128b. For example, the first electrode 131 may be in contact with the drain electrode 128b through a contact hole formed in the planarization layer 129. The first electrode 131 may be a reflective electrode. The first electrode 131 may include a reflective layer formed of silver (Ag), magnesium (Mg), aluminum (Al), platinum (Pt), palladium (Pd), gold (Au), nickel (Ni), neodymium (Nd), iridium (Jr), chromium (Cr), or the like and a transmitting layer formed of indium tin oxide (ITO), indium zinc oxide (IZO), zinc oxide (ZnO), indium oxide ($In_2O_3$), or the like. For example, the first electrode 131 may be formed as a multi-layer structure such as ITO/Ag/ITO.

A pixel defining layer 132 may be disposed on the planarization layer 129 around the first electrode 131. The pixel defining layer 132 may cover an edge of the first electrode 131, and may include an opening that exposes a center of the first electrode 131. The pixel defining layer 132 may include an organic material such as photoresist, polyacrylate-based resin, polyimide-based resin, siloxane-based resin, acryl-based resin, epoxy-based resin, or the like.

The organic light emitting layer 133 may be disposed on the first electrode 131. The organic light emitting layer 133 may be disposed in the opening of the pixel defining layer 132.

The organic light emitting layer 133 may be formed of a low molecular organic material or a high molecular organic material. When the organic light emitting layer 133 is formed of the low molecular organic material, a hole injection layer (HIL) and a hole transport layer (HTL) may be formed between the first electrode 131 and the organic light emitting layer 133, and an electron transport layer (ETL) and an electron injection layer (EIL) may be formed on the organic light emitting layer 133. When the organic light emitting layer 133 is formed of the high molecular organic material, the HTL may be formed between the first electrode 131 and the organic light emitting layer 133.

The second electrode 134 may be disposed on the organic light emitting layer 133. The second electrode 134 may be commonly provided to the pixels. The second electrode 134 may be a transmitting electrode. For example, the second electrode 134 may be formed of metal, metal alloy, metallic nitride, transparent metallic oxide, transparent conductive material, or the like.

A thin film encapsulation layer encapsulating the display element DE may be formed on the second electrode 134. The thin film encapsulation layer may include at least one organic layer and at least one inorganic layer.

The organic layer may include a polymer, and may be a single layer or a stacked layer including, for example, one of polyethylene terephthalate, polyimide, polycarbonate, epoxy, polyethylene, and polyacrylate. In an embodiment, the organic layers may include polyacrylate. Specifically, the organic layer may include a polymerized monomer composition including diacrylate-based monomer and triacrylate-based monomer. The monomer composition may further include monoacrylate-based monomer. Also, the monomer composition may further include a well-known photoinitiator such as trimethyl benzoyl diphenyl phosphine oxide ("TPO"), however, the present invention is not limited thereto.

The inorganic layer may be a single layer or a stacked layer including metal oxide or metal nitride. In an embodiment, the inorganic layers may include one of $SiN_x$, $Al_2O_3$, $SiO_2$, and $TiO_2$.

The protective film 140 may be disposed under the substrate SUB. The protective film 140 may absorb impact from outside thereby preventing the display device 100 from being damaged by the impact. The protective film 140 may be formed of a material containing air such as cushion, sponge, or the like to absorb impact. For example, the protective film 140 may include polyethylene terephthalate (PET) or the like. An adhesive layer may be formed between the substrate SUB and the protective film 140 and may attach the protective film 140 to the substrate SUB.

Figure 5:
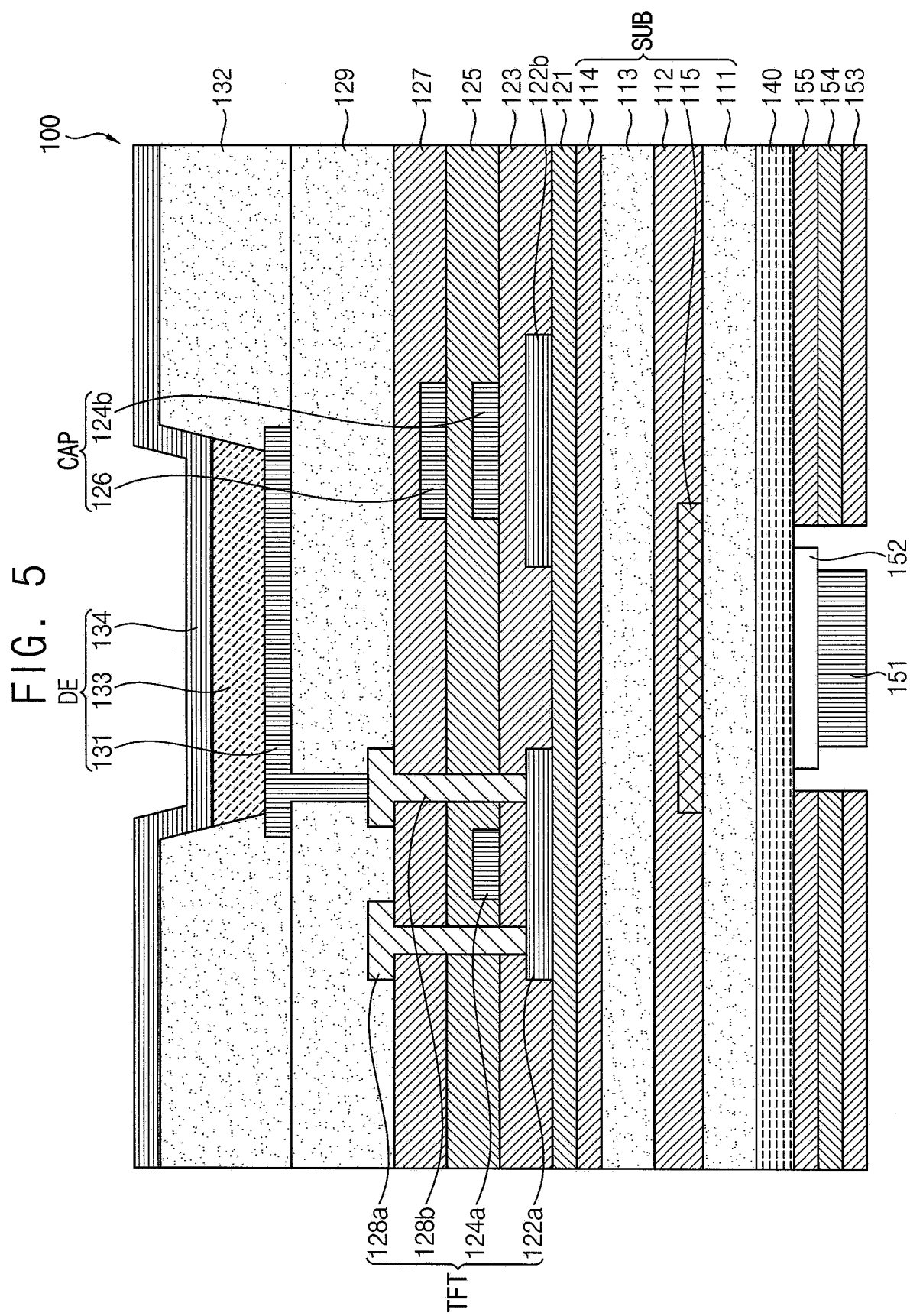

Referring to FIG. 5, the display device 100, according to an embodiment of the present disclosure, may further include a sensor 151 disposed under the substrate SUB. For example, the sensor 151 may be disposed under the substrate SUB with the protective film 140 disposed in between.

In an exemplary embodiment of the present disclosure, the sensor 151 may be a fingerprint recognition sensor configured to sense a fingerprint of a user. The sensor 151 may be disposed in a display region on which the display element DE is located.

The sensor 151 may be attached to a bottom of the protective film 140 via an adhesive layer 152. Ultraviolet light may be cast to a bottom of the substrate SUB to harden the adhesive layer 152. If the ultraviolet light passes through the substrate SUB, the thin film transistor TFT, the capacitor CAP, or display element DE may be adversely affected. Further, when the ultraviolet light is cast onto the substrate SUB, a stain may be generated on the display device 100 due to the ultraviolet light.

To solve the aforementioned problem, the substrate SUB may include an ultraviolet light blocking layer 115 that at least partially overlaps the sensor 151 in a plan view. In an exemplary embodiment of the present disclosure, the ultraviolet light blocking layer 115 may be patterned such that at least a portion of the ultraviolet light blocking layer 115 overlaps the sensor 151. A width of the ultraviolet light blocking layer 115 may be greater than or substantially the same as a width of the sensor 151.

A cushion layer 153, an embossing layer 154, and a light shielding layer 155 may be disposed on a portion of the bottom of the protective layer 140 on which the sensor 151 is not disposed.

The cushion layer 153 may be disposed under the substrate SUB, and may reduce impact that may otherwise be applied to the display device 100. The cushion layer 153 may include polymer such as polypropylene (PP) or polyethylene (PE). In an exemplary embodiment of the present disclosure, the cushion layer 153 may include any material that has a density of about 0.5 g/cm$^3$ or more. The cushion layer 153 may be formed as a foam or gel. In an exemplary embodiment of the present disclosure, the cushion layer 153 may include a material having high elastic force, for example, rubber.

The embossing layer 154 may be disposed between the substrate SUB and the cushion layer 153. The embossing layer 154 may be adhesive. The embossing layer 154 may include polyethylene terephthalate (PET) or the like.

The shielding layer 155 may be configured to prevent elements disposed under the substrate SUB from being viewed. The shielding layer 155 may be disposed between the substrate SUB and the embossing layer 154. The shielding layer 155 may be formed of polyethylene terephthalate (PET) or the like by a screen printing process or the like.

Hereinafter, a display device according to some exemplary embodiments of the present disclosure will be described with reference to FIGS. 6, 7, 8, 9, and 10.

FIGS. 6, 7, 8, 9, and 10 are cross-sectional views illustrating a display device according to some exemplary embodiments of the present disclosure.

Referring to FIGS. 6, 7, 8, 9, and 10, a display device 200, according to some exemplary embodiments of the present disclosure may include a substrate SUB, a pixel circuit disposed on the substrate SUB, and a display element DE disposed on the pixel circuit. The pixel circuit may include a thin film transistor TFT and a capacitor CAP. The display device 200 may further include a protective film 240 disposed under the substrate SUB.

In describing various elements of the display device 200 with reference to FIGS. 6, 7, 8, 9, and 10, some elements may be substantially the same as or similar to corresponding elements of the display device 100 described with reference to FIGS. 1, 2, 3, 4, and 5. To the extent that a detailed description of elements is omitted, it may be assumed that these elements are at least similar to the corresponding elements that have already been described.

Figure 6:
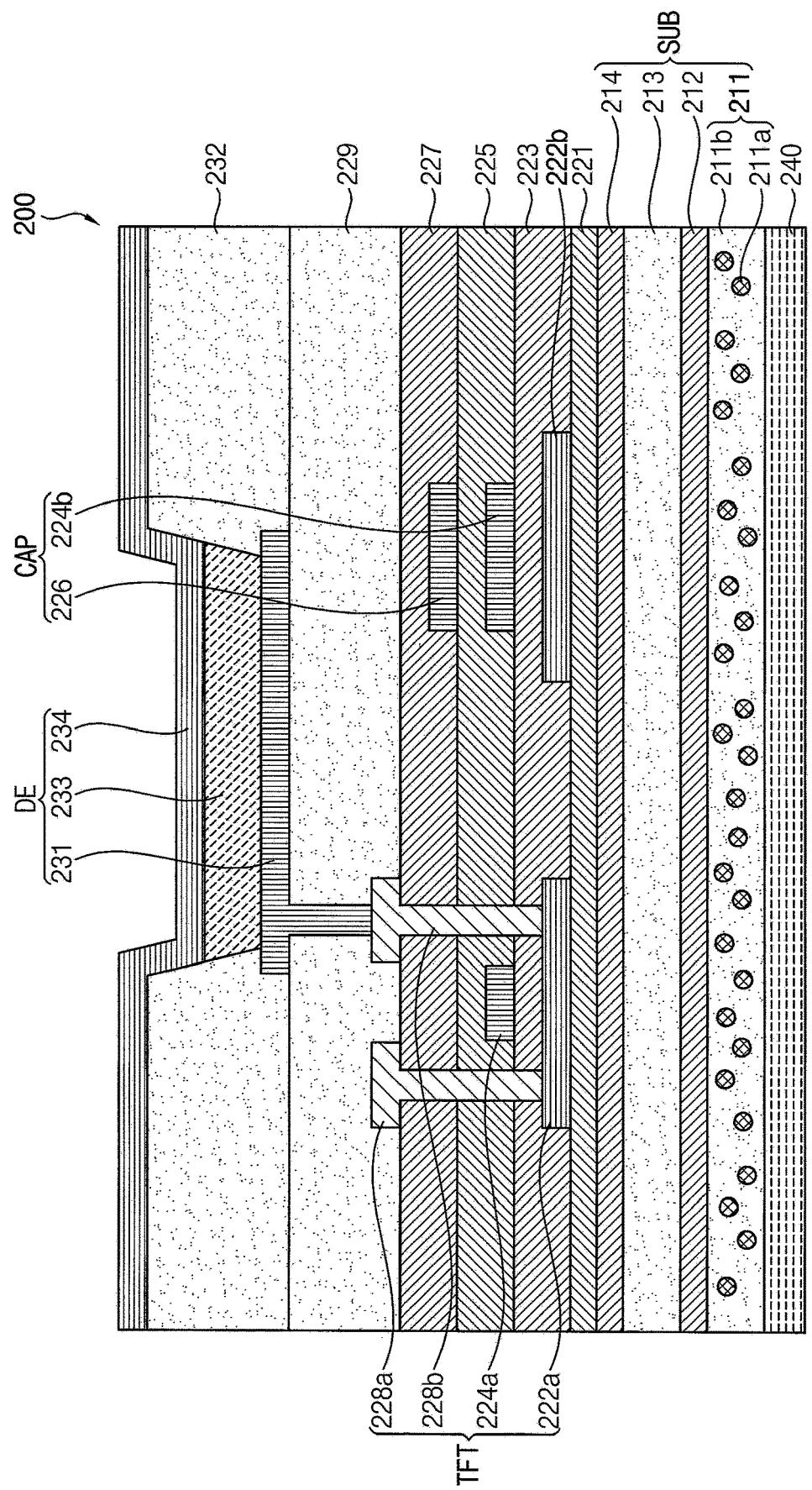
FIGS. 6, 7, 8, 9, and 10 are cross-sectional views illustrating a display device according to exemplary embodiments of the present disclosure.
Figure 7:
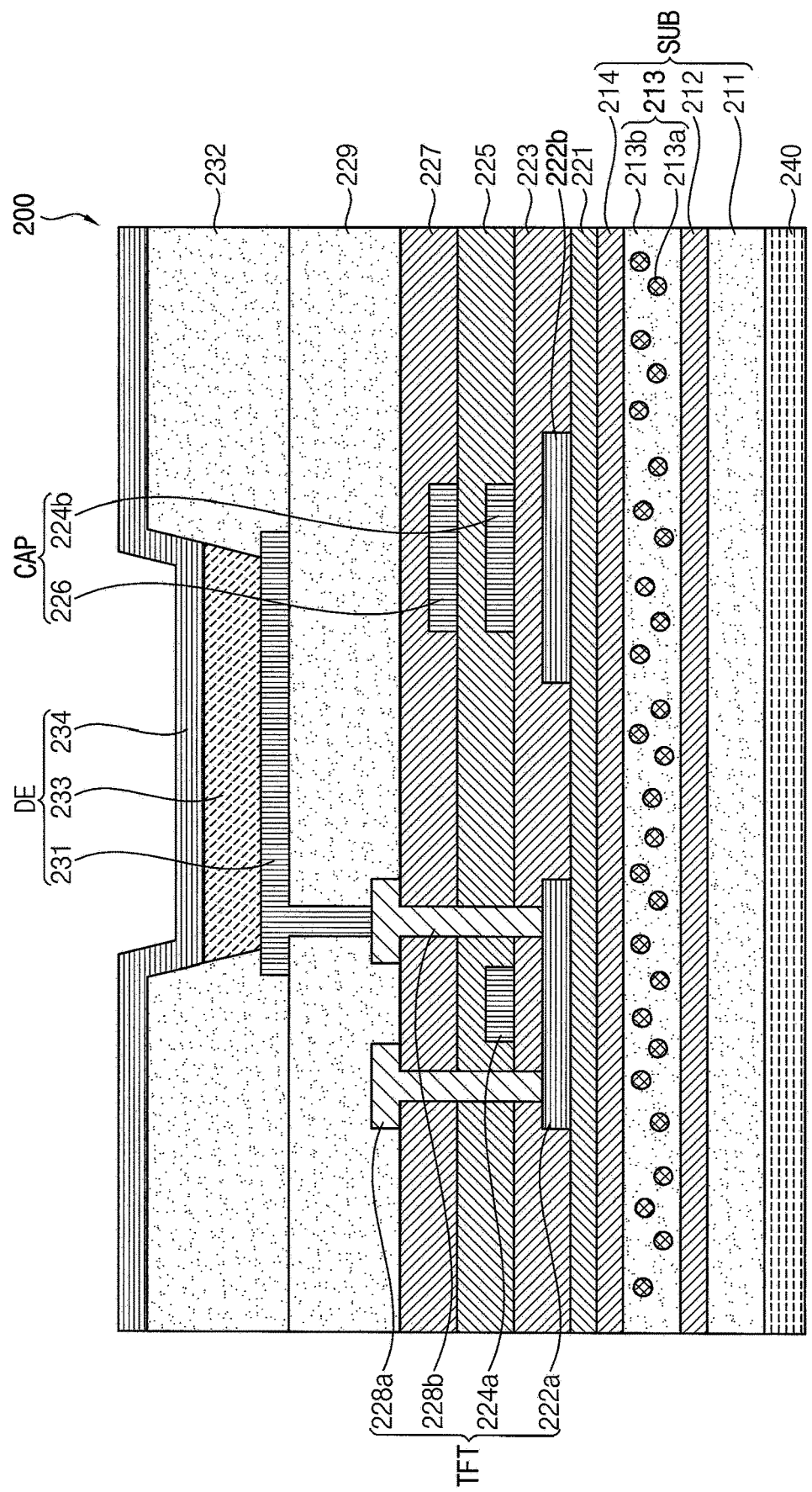
Figure 8:
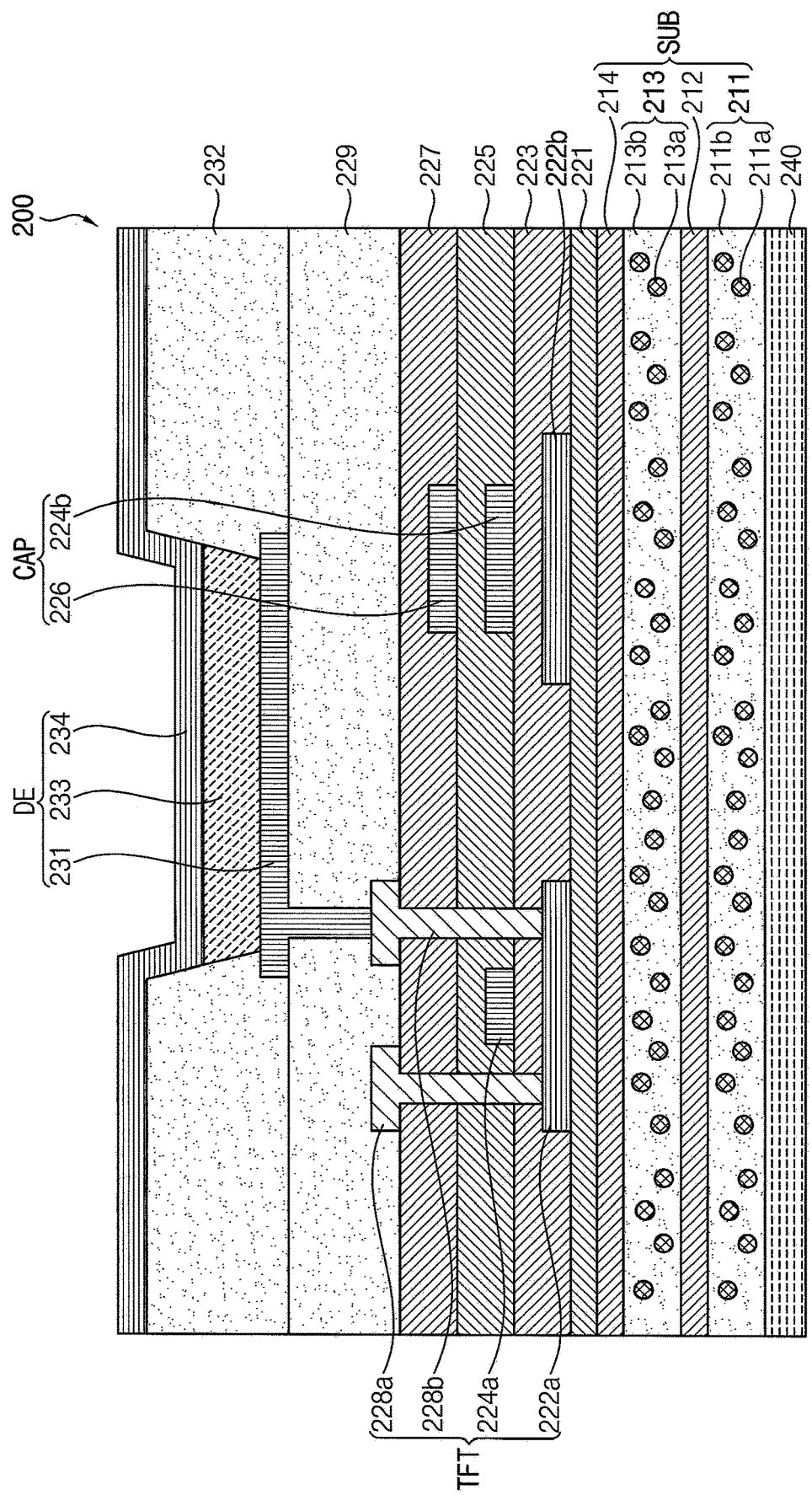

Referring to FIGS. 6, 7, and 8, the substrate SUB may include a first substrate layer 211, a first barrier layer 212, a second substrate layer 213, and a second barrier layer 214.

The first substrate layer 211 and/or the second substrate layer 213 may include a matrix including an organic material and a plurality of ultraviolet light blocking particles dispersed within the matrix.

The ultraviolet light blocking particles may include an organic material such as a benzophenone compound, a benzotriazole compound, a benzoate compound, a cyanoacrylate compound, a triazine compound, an oxanilide compound, and/or a salicylate compound.

An amount of the ultraviolet light blocking particles in the matrix may vary, for example, depending on the thickness of the first and/or second substrate layers 211 and/or 213, the absorption wavelength range of the ultraviolet light blocking particles, or the like. For example, the ultraviolet light blocking particles may be included in an amount of about 0.1 wt % to about 20 wt %.

The matrix may include an organic material based on which the film characteristics of the first and/or second substrate layers 211 and/or 213, and may include, for example, an organic material such as polyimide (PI), polyethylene naphthalate (PEN), polyethylene terephthalate (PET), polyarylate (PAR), polycarbonate (PC), polyetherimide (PEI), polyethersulfone (PS), or the like.

Various methods may be used to form the first and/or second substrate layers 211 and/or 213. For example, an organic film forming layer, including, for example, a mixture of a first monomer including an organic material for forming the matrix and a second monomer including the ultraviolet light blocking particles, may be accommodated on a carrier substrate by using methods, such as evaporation, inkjet printing, screen printing, and spin coating.

In an exemplary embodiment of the present disclosure, the ultraviolet light blocking particles may be cross-linked within the matrix.

The ultraviolet light blocking particles may include, for example, an acrylate group, a methacrylate group, and/or an epoxy group, and may have a structure in which the material or compound is coupled with at least one functional group from among an acrylate group, a methacrylate group, and an epoxy group. The functional group may be cross-linked within the matrix, which may provide a more dense film characteristic to the first and/or second substrate layers 211 and/or 213.

Referring to FIG. 6, in an exemplary embodiment of the present disclosure, the first substrate layer 211 may include a first matrix 211*b* including an organic material and a plurality of first ultraviolet light blocking particles 211*a* dispersed in the first matrix 211*b*, and the second substrate layer 213 might not include the ultraviolet light blocking particles. The first substrate layer 211 may block ultraviolet light cast to a bottom of the display device 200.

Referring to FIG. 7, in another embodiment, the second substrate layer 213 may include a second matrix 213*b* including an organic material and a plurality of second ultraviolet light blocking particles 213*a* dispersed in the second matrix 213*b*, and the first substrate layer 211 might not include the ultraviolet light blocking particles. The second substrate layer 213 may block ultraviolet light cast to the bottom of the display device 200.

Referring to FIG. 8, according to an exemplary embodiment of the present disclosure, the first substrate layer 211 may include a first matrix 211*b* including an organic material and a plurality of first ultraviolet light blocking particles 211*a* dispersed in the first matrix 211*b*, and the second substrate layer 213 may include a second matrix 213*b* including an organic material and a plurality of second ultraviolet light blocking particles 213*a* dispersed in the second matrix 213*b*. The first and second substrate layers 211 and 213 may block ultraviolet light cast to the bottom of the display device 200.

Figure 9:
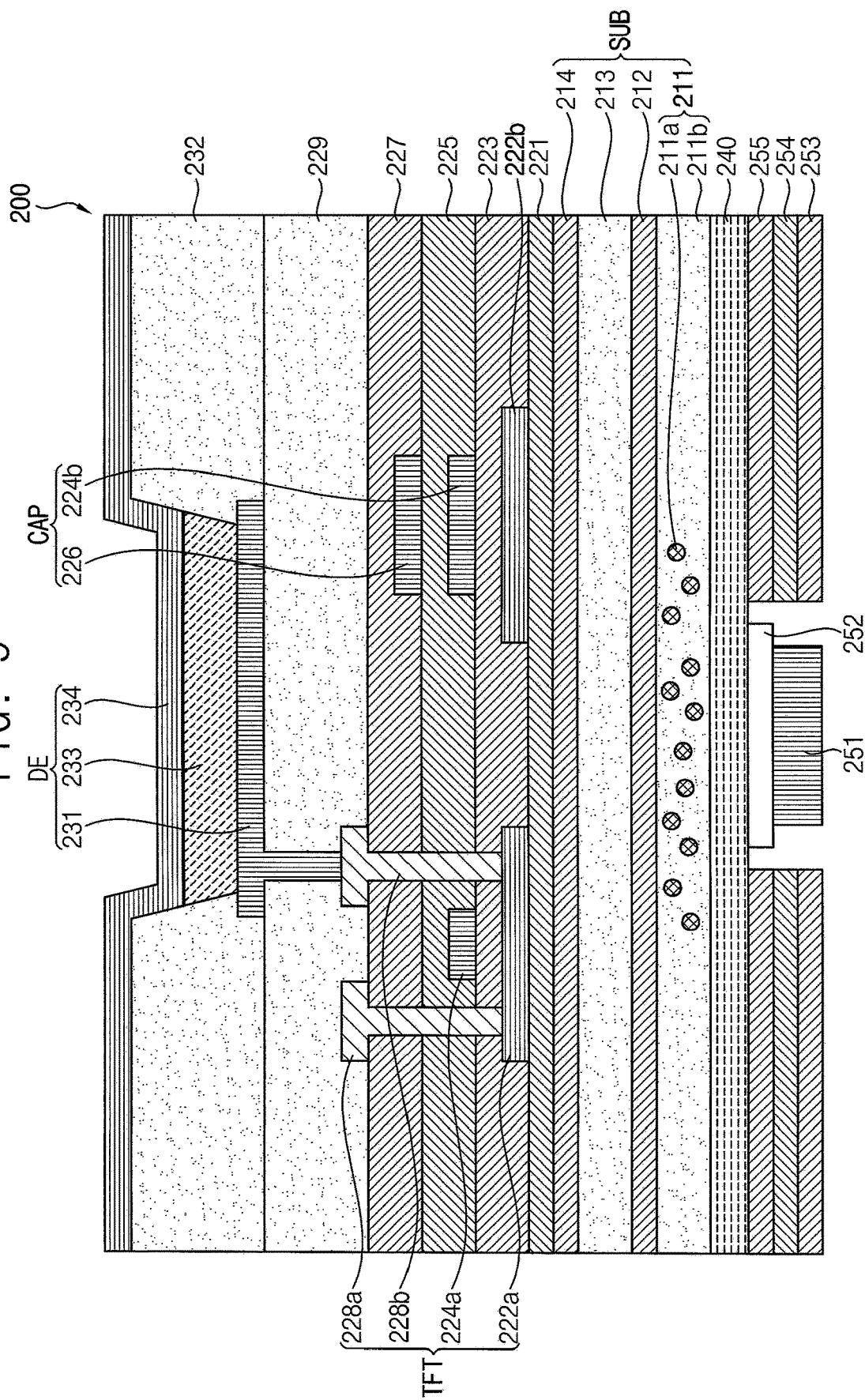

Referring to FIG. 9, the display device 200, according to an exemplary embodiment of the present disclosure, may further include a sensor 251 disposed under the substrate SUB. For example, the sensor 251 may be disposed under the substrate SUB with the protective film 240 disposed in between. The first substrate layer 211 may include the first ultraviolet light blocking particles 211*a* overlapping the sensor 251 in a plan view. The first ultraviolet light blocking particles 211*a* may be dispersed within the first matrix 211*b* to overlap the sensor 251, and the first ultraviolet light blocking particles 211*a* might not be located in a portion of the first substrate layer 211 which does not overlap the sensor 251. For example, a width of a region in which the first ultraviolet light blocking particles 211*a* are located may be greater than or substantially the same as a width of the sensor 251.

Figure 10:
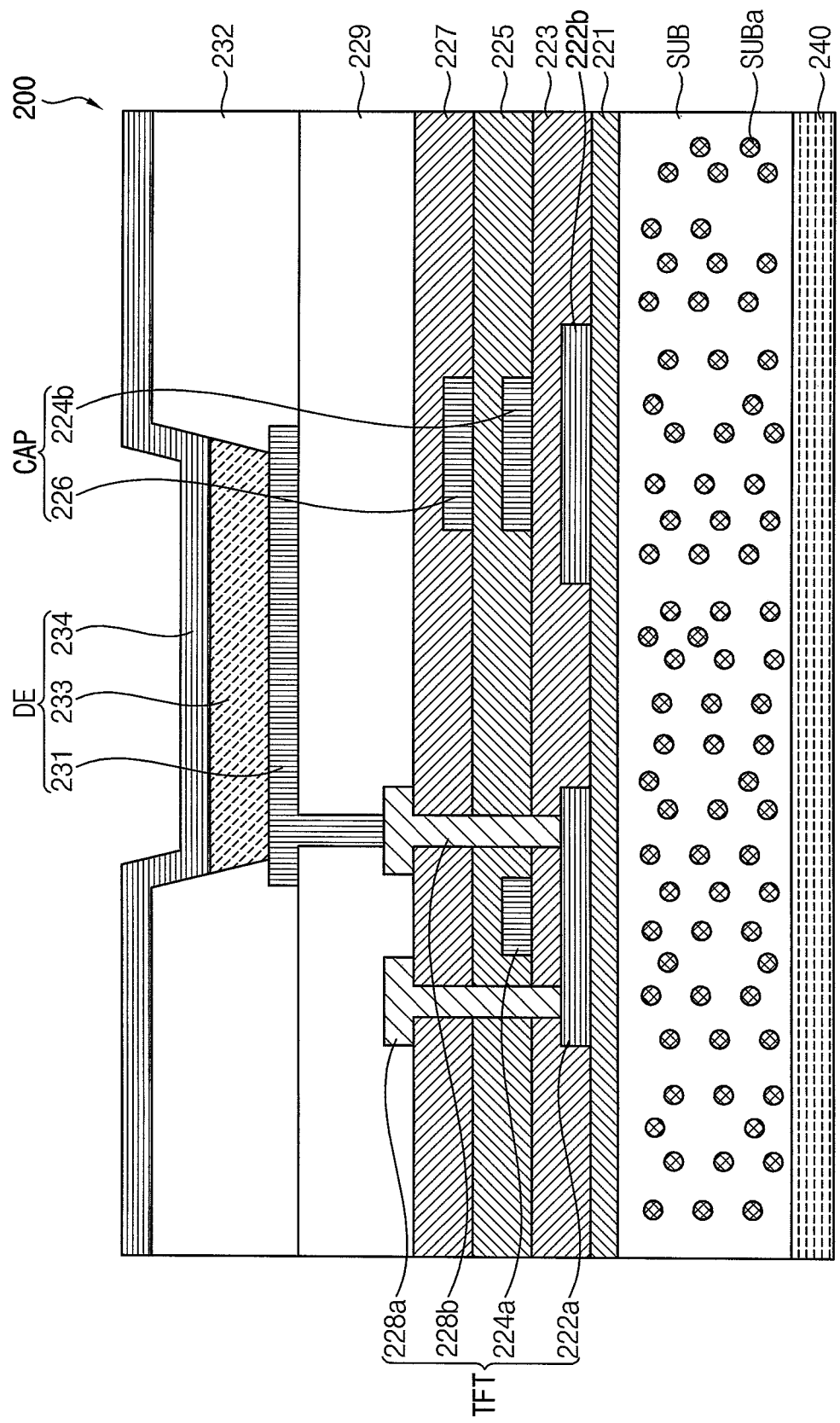

Referring to FIG. 10, the substrate SUB of the display device 200, according to an exemplary embodiment of the present disclosure, might not include the first substrate layer 211, the first barrier layer 212, the second substrate layer 213, and the second barrier layer 214, different from the substrate SUB of the display device 200 described above. The substrate SUB may include a plurality of ultraviolet light blocking particles SUBa dispersed therein.

In an exemplary embodiment of the present disclosure, the substrate SUB may include an organic material such as polyimide (PI), polyethylene naphthalate (PEN), polyethylene terephthalate (PET), polyarylate (PAR), polycarbonate (PC), polyetherimide (PEI), polyethersulfone (PS), or the like. In an exemplary embodiment of the present disclosure, the substrate SUB may include glass, quartz, ceramic, metal, or the like.

The display device, according to exemplary embodiments of the present disclosure, may be applied to a display device included in a computer, a notebook, a mobile phone, a smartphone, a smart pad, a PMP, a PDA, an MP3 player, or the like.

Although the display devices, according to exemplary embodiments of the present invention, have been described with reference to the drawings, the illustrated embodiments are examples, and may be modified and changed by a person having ordinary knowledge in the relevant technical field without departing from the technical spirit of the present disclosure.

What is claimed is:

1. A display device, comprising:
   a substrate;
   a thin film transistor disposed on the substrate;
   a display element electrically connected to the thin film transistor; and
   a sensor disposed under the substrate,
   wherein the substrate comprises:
      a first substrate layer;
      a second substrate layer disposed on the first substrate layer; and
      a plurality of ultraviolet light blocking particles dispersed within the first substrate layer and overlapping the sensor.

2. The display device of claim 1, wherein the ultraviolet light blocking particles are omitted from areas of the first substrate layer that do not overlap the sensor.

3. The display device of claim 1, wherein the sensor is a fingerprint recognition sensor.

4. The display device of claim 1, wherein a width of a region of the first substrate layer in which the first ultraviolet light blocking particles are located is greater than or substantially the same as a width of the sensor.

5. The display device of claim 1, wherein the first substrate is a matrix including an organic, material.

6. The display device of claim 5, wherein the ultraviolet light blocking particles are cross-linked within the matrix.

7. The display device of claim 5, wherein the organic material of the first substrate layer includes polyimide (PI), polyethylene naphthalate (PEN), polyethylene terephthalate (PET), polyarylate (PAR), polycarbonate (PC), and/or polyetherimide (PEI), polyethersulfone (PS).

8. The display device of claim 5, wherein the ultraviolet light blocking particles include an acrylate group, a methacrylate group, and/or an epoxy group, and have a structure that is coupled with at least one functional group from among an acrylate group, a methacrylate group, and an epoxy group.

9. The display device of claim 8, wherein the functional group is cross-linked within the matrix.

10. The display device of claim 1, wherein the ultraviolet light blocking particles include an organic material.

11. The display device of claim 10, wherein the organic material of the ultraviolet light blocking particles is a benzophenone compound, a benzotriazole compound, a benzoate compound, a cyanoacrylate compound, a triazine compound, an oxanilide compound, and/or a salicylate compound.

12. The display device of claim 1, wherein the ultraviolet light blocking particles are dispersed within the first substrate layer in an amount of about 0.1 wt % to about 20 wt %.

* * * * *